(12) United States Patent
Liu et al.

(10) Patent No.: US 9,699,902 B1
(45) Date of Patent: Jul. 4, 2017

(54) PRINTED CIRCUIT BOARD MADE THROUGH SINTERING COPPER NANO-PARTICLES

(71) Applicant: Flextronics AP, LLC, Broomfield, CO (US)

(72) Inventors: Weifeng Liu, Dublin, CA (US); David Geiger, Dublin, CA (US); Anwar Mohammed, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 376 days.

(21) Appl. No.: 14/340,432

(22) Filed: Jul. 24, 2014

(51) Int. Cl.
| | |
|---|---|
| *H05K 1/14* | (2006.01) |
| *H05K 1/11* | (2006.01) |
| *H05K 1/09* | (2006.01) |
| *H05K 3/46* | (2006.01) |
| *H05K 1/02* | (2006.01) |
| *H05K 3/36* | (2006.01) |
| *H05K 3/42* | (2006.01) |

(52) U.S. Cl.
CPC ........... *H05K 1/144* (2013.01); *H05K 1/0271* (2013.01); *H05K 1/09* (2013.01); *H05K 1/097* (2013.01); *H05K 1/116* (2013.01); *H05K 3/36* (2013.01); *H05K 3/42* (2013.01); *H05K 3/4623* (2013.01)

(58) Field of Classification Search
CPC ...... H05K 1/144; H05K 1/0271; H05K 1/116; H05K 3/4611; H05K 3/4614; H05K 3/462; H05K 3/4623; H05K 3/4617
See application file for complete search history.

(56) References Cited

U.S. PATENT DOCUMENTS

| | | | |
|---|---|---|---|
| 2012/0031649 A1* | 2/2012 | Antesberger | H05K 3/4069 174/251 |
| 2013/0075137 A1* | 3/2013 | Weatherspoon | H05K 3/4614 174/255 |
| 2016/0212862 A1* | 7/2016 | Rathburn | H05K 1/0393 |

* cited by examiner

*Primary Examiner* — Timothy Thompson
*Assistant Examiner* — Amol Patel
(74) *Attorney, Agent, or Firm* — Haverstock & Owens LLP

(57) ABSTRACT

A printed circuit board is formed from a plurality of thinner PCBs stacked on top of each other with an intermediate metal interconnect material selectively positioned between adjacent PCBs. The metal interconnect material is selectively positioned on surface contact points of correspondingly aligned plated through holes on the adjacent printed circuit boards. The stacked printed circuit boards and intermediate metal interconnect material are laminated, thereby sintering the metal interconnect material and the surface contact points of the plated through holes to form electrical interconnects between plated through holes on adjacent printed circuit boards. The metal interconnect material is preferably the same as the plating material used to plate the through holes, such as copper.

30 Claims, 3 Drawing Sheets

US 9,699,902 B1

PRINTED CIRCUIT BOARD MADE THROUGH SINTERING COPPER NANO-PARTICLES

FIELD OF THE INVENTION

The present invention is generally directed to the field of printed circuit boards. More specifically, the present invention is directed to a printed circuit board made through sintering copper nano-particles.

BACKGROUND OF THE INVENTION

A printed circuit board (PCB) mechanically supports and electrically connects electronic components using conductive traces, pads and other features etched from conductive sheets, such as copper, laminated onto a non-conductive substrate, or PCB laminate. PCBs can be single sided (one copper layer), double sided (two copper layers) or multi-layered. Conductors on different layers are connected with plated through holes called vias. Advanced PCBs may contain components, such as capacitors, resistors or active devices, embedded in the PCB laminate. The through holes are formed after all layers of the PCB are laminated together. A drill or laser is commonly used to form each through hole. The through hole walls for multi-layers PCBs can be made conductive and then electroplated with copper to form the plated-through holes.

A conventional fabrication technique for making a multi-layer PCB is to start with a two-sided copper-clad laminate, etch the circuitry on both copper sides, then laminate to the top and bottom prepreg and copper foil. Lamination is done by placing the stack of materials in a press and applying pressure and heat for a period of time. This results in a one piece product. Additional layers can be similarly added to the top and/or bottom. Once all the layers are added, the PCB is drilled to form through holes, plated to form plated through holes, and the top and bottom copper foils are etched to form conductive traces on the top and bottom layers.

Typical PCB thickness is in the range of 1-2 mm. For applications such as mainframe computers, servers and routers, a backplane is used which is a thicker PCB, for example 8-10 mm or greater. As PCBs are designed with more and more layers, the larger PCB thicknesses result in larger aspect ratios. The aspect ratio is the ratio of the through hole length to the through hole diameter. The larger aspect ratios exceed the fabrication limit for plating the through holes, even with more advanced plating technologies such as reverse pulse plating.

A conventional fabrication technique for making thicker PCBs is to laminate together multiple thinner PCBs. Each of the thinner PCBs can be made in a manner similar to that described above, having fully formed plated through holes. The thinner PCBs are stacked on top of each other and properly aligned, the plated through holes in each thinner PCB having been positioned to aligned with corresponding plated through holes of the other thinner PCBs when stacked. As each plated through hole is intended to provide an electrical connection from the top to the bottom of the stack, the aligned plated through holes on adjacently stacked thinner PCBs need to be electrically connected. Conventional methods apply a conductive adhesive at the inter-thinner PCB electrical connection point between aligned plated through holes, sometimes referred to as a Z-interconnect. However, using a conductive adhesive to form the Z-interconnect results in reliability, due in part to the coefficient of thermal expansion (CTE) mismatch between the conductive adhesive, which is typically a polymer epoxy, and the metal plating of the plated through hole, which is typically copper. Also, during the lamination process bubbles, voids or trapped air may form in the conductive adhesive, further negatively effecting reliability of the Z-interconnect.

SUMMARY OF THE INVENTION

A printed circuit board is formed from a plurality of thinner PCBs stacked on top of each other with an intermediate metal interconnect material selectively positioned between adjacent PCBs. The metal interconnect material is selectively positioned on surface contact points of correspondingly aligned plated through holes on the adjacent printed circuit boards. The stacked printed circuit boards and intermediate metal interconnect material are laminated, thereby sintering the metal interconnect material and the surface contact points of the plated through holes to form electrical interconnects between plated through holes on adjacent printed circuit boards. The metal interconnect material is preferably the same as the plating material used to plate the through holes, such as copper.

In an aspect, a printed circuit board is disclosed which includes a plurality of printed circuit boards and metal interconnect material. Each printed circuit board includes one or more layers of non-conducting substrate and conducting material. Each printed circuit board also includes one or more plated through holes, each plated through hole having a surface contact point on either end. The plurality of printed circuit boards are stacked on top of each other such that corresponding plated through holes on each printed circuit board are properly aligned. The metal interconnect material is positioned between the surface contact points of plated through holes on adjacently stacked printed circuit boards. The plurality of circuit boards are laminated together thereby sintering the metal interconnect material and the surface contact points of the plated through holes. In some embodiments, if a given printed circuit board of the plurality of circuit boards has multiple layers, then the multiple layers are laminated together. In some embodiments, the metal interconnect material is a same material as a plating material of the plated through holes. In some embodiments, the metal interconnect material is copper and the plated through holes are plated with copper. In some embodiments, the metal interconnect material is made of copper nano-particles. In some embodiments, the metal interconnect material is made of copper nano-particle ink. In some embodiments, the non-conducting substrate comprises a prepreg material.

In another aspect, a printed circuit board is disclosed which includes a plurality of printed circuit boards, one or more interposers and a metal interconnect material. Each printed circuit board includes one or more layers of non-conducting substrate and conducting material. Each printed circuit board also includes one or more plated through holes, each plated through hole having a surface contact point on either end. Each interposer includes one or more interposer plated through holes, each interposer plated through hole having a surface contact point on either end. The plurality of printed circuit boards and the one or more interposers are alternatively stacked on top of each other such that corresponding plated through holes on each printed circuit board and interposer plated through holes on each adjacently stacked interposer are properly aligned. The metal interconnect material is positioned between the surface contact points of plated through holes and the surface contact points on interposer plated through holes on each adjacently stacked printed circuit board and interposer. The plurality of circuit boards and the one or more interposers are laminated together thereby sintering the metal interconnect material, the surface contact points of the plated through holes and the surface contact points of the interposer plated through holes. In some embodiments, each interposer includes a non-conducting substrate.

In yet another aspect, a method of fabricating a printed circuit board is disclosed. The method includes fabricating a plurality of printed circuit boards. Each printed circuit board includes one or more layers of non-conducting substrate and conducting material. Each printed circuit board also includes one or more plated through holes, each plated through hole having a surface contact point on either end. The method also includes stacking the plurality of printed circuit boards on top of each other with an intermediate metal interconnect material applied between adjacently stacked printed circuit boards. The plurality of printed circuit boards are stacked such that corresponding plated through holes on each printed circuit board are properly aligned. The metal interconnect material is positioned between the surface contact points of plated through holes on adjacently stacked printed circuit boards. The method also includes laminating the plurality of circuit boards and the one or more interposers together thereby sintering the metal interconnect material and the surface contact points of the plated through holes.

In still yet another aspect, another method of fabricating a printed circuit board is disclosed. The method includes fabricating a plurality of printed circuit boards. Each printed circuit board includes one or more layers of non-conducting substrate and conducting material. Each printed circuit board also includes one or more plated through holes, each plated through hole having a surface contact point on either end. The method also includes fabricating one or more interposers. Each interposer includes one or more interposer plated through holes, each interposer plated through hole having a surface contact point on either end. The method also includes alternatively stacking the plurality of printed circuit boards and the one or more interposers on top of each other such that corresponding plated through holes on each printed circuit board and interposer plated through holes on each adjacently stacked interposer are properly aligned. The metal interconnect material is positioned between the surface contact points of plated through holes and the surface contact points on interposer plated through holes on each adjacently stacked printed circuit board and interpose. The method also includes laminating the plurality of circuit boards together thereby sintering the metal interconnect material, the surface contact points of the plated through holes and the surface contact points of the interposer plated through holes.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a printed circuit board. Those of ordinary skill in the art will realize that the following detailed description of the printed circuit board is illustrative only and is not intended to be in any way limiting. Other embodiments of the printed circuit board will readily suggest themselves to such skilled persons having the benefit of this disclosure.

Reference will now be made in detail to implementations of the printed circuit board as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments are directed to a printed circuit board and a method of fabricating the printed circuit board. The printed circuit board is formed from a plurality of thinner PCBs laminated together with an intermediate metal interconnect material selectively positioned between adjacent PCBs to function as an electrical interconnect. In some embodiments, the metal interconnect material is selectively positioned on contact points of correspondingly aligned plated through holes on the adjacent printed circuit boards such that aligned plated through holes an adjacent thinner PCBs are electrically interconnected. In some embodiments, the metal interconnect material is sintered to the plating of the contact point during the lamination process. Sintering is the process of forming a solid mass of material by heat and/or pressure without melting the material to the point of liquification. Although the embodiments described herein are directed to sintering metals, sintering can be performed as a manufacturing process applied to metals, ceramics, plastics, and other materials.

Figure 1:
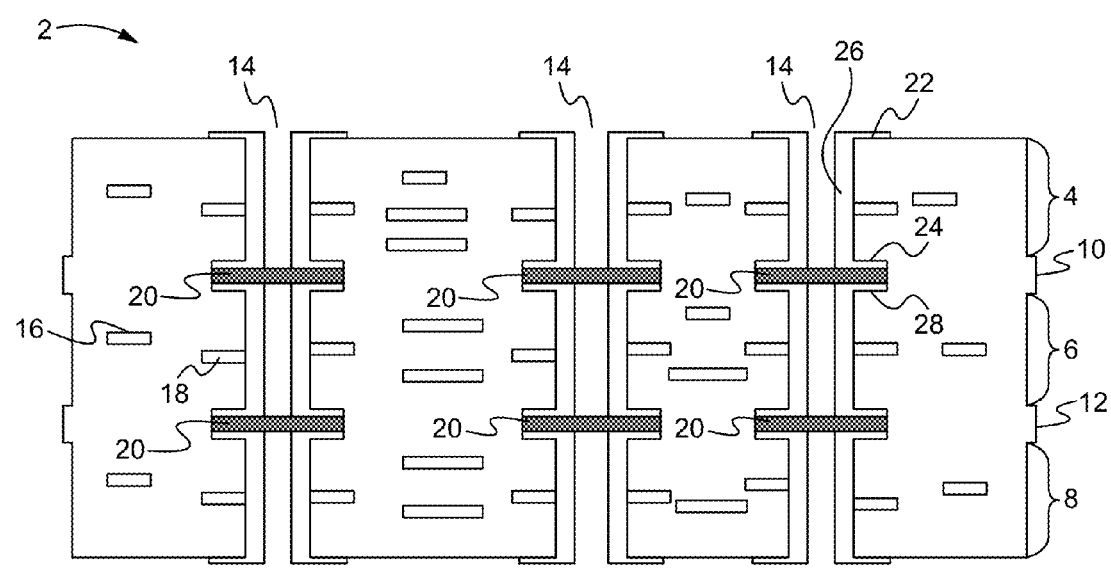
FIG. 1 illustrates a cut-out side view of a PCB according to an embodiment.

FIG. 1 illustrates a cut-out side view of a PCB according to an embodiment. In this exemplary application the PCB is designed to be a backplane. It is understood that the concepts described in regarding to the backplane application can be applied generally to a PCB having alternate applications. The backplane 2 shown in FIG. 1 includes three thinner PCBs 4, 6 and 8 laminated together. Although the backplane 2 is shown in FIG. 1 to have three thinner PCBs this is for exemplary purposes only. It is understood that a printed circuit board can have two or more thinner PCBs laminated together. The thinner PCBs are each pre-manufactured. Each of the thinner PCBs has one or more layers, where a layer includes both a non-conductive substrate portion and a conductive material portion. Each layer of the thinner PCB can include one or more conductive interconnects made of the conductive material, for example an internal interconnect 16 and a post interconnect 18. Each thinner PCB can have the same or different number of layers than the other thinner PCBs. Each thinner PCB has a first surface and a second surface opposing the first surface, and one or more plated through holes (PTHs) extending from the first surface through the thinner PCB to the second surface. A barrel wall that forms the through hole is plated as are surface contact points on the first surface and the second surface adjacent the through hole opening. FIG. 1 shows exemplary surface contact points 22 on a first surface of the thinner PCB 4 and surface contact points 24 on a second surface of the thinner PCB 4. Aligned surface contact points 22 and 24 are electrically connected to plating 26 within a corresponding PTH 14. The surface contact point can be formed around an entire perimeter of the PTH, as in an annular ring. Alternatively, the surface contact point can be one or more surface areas adjacent, or proximate, to and in electrical connection with the PTH.

Metal interconnect material 20 is selectively positioned between adjacent thinner PCBs. In particular, metal interconnect material is positioned between a surface contact point on one thinner PCB and an aligned surface contact point on an adjacent thinner PCB. For example, metal interconnect material 20 is positioned between surface contact point 24 on the second surface of the thinner PCB 4 and a surface contact point 28 on a first surface of the thinner PCB 6. The thinner PCBs 4, 6 and 8 are stacked and aligned on top of each other with the appropriate metal interconnect material 20 selectively placed between each thinner PCB. The stack is laminated, thereby sintering the metal interconnect material 20 and the corresponding surface contact points on the adjacent thinner PCBs. The sintered metal interconnect material and surface contact points forms an electrical interconnect between aligned PTHs on adjacent thinner PCBs. The metal interconnect material 20 is shown in FIG. 1 as being positioned over the surface contact points and the opening of the PTH. Alternatively, the metal interconnect material can be applied so that the opening of the PTH is not covered.

Figure 2:
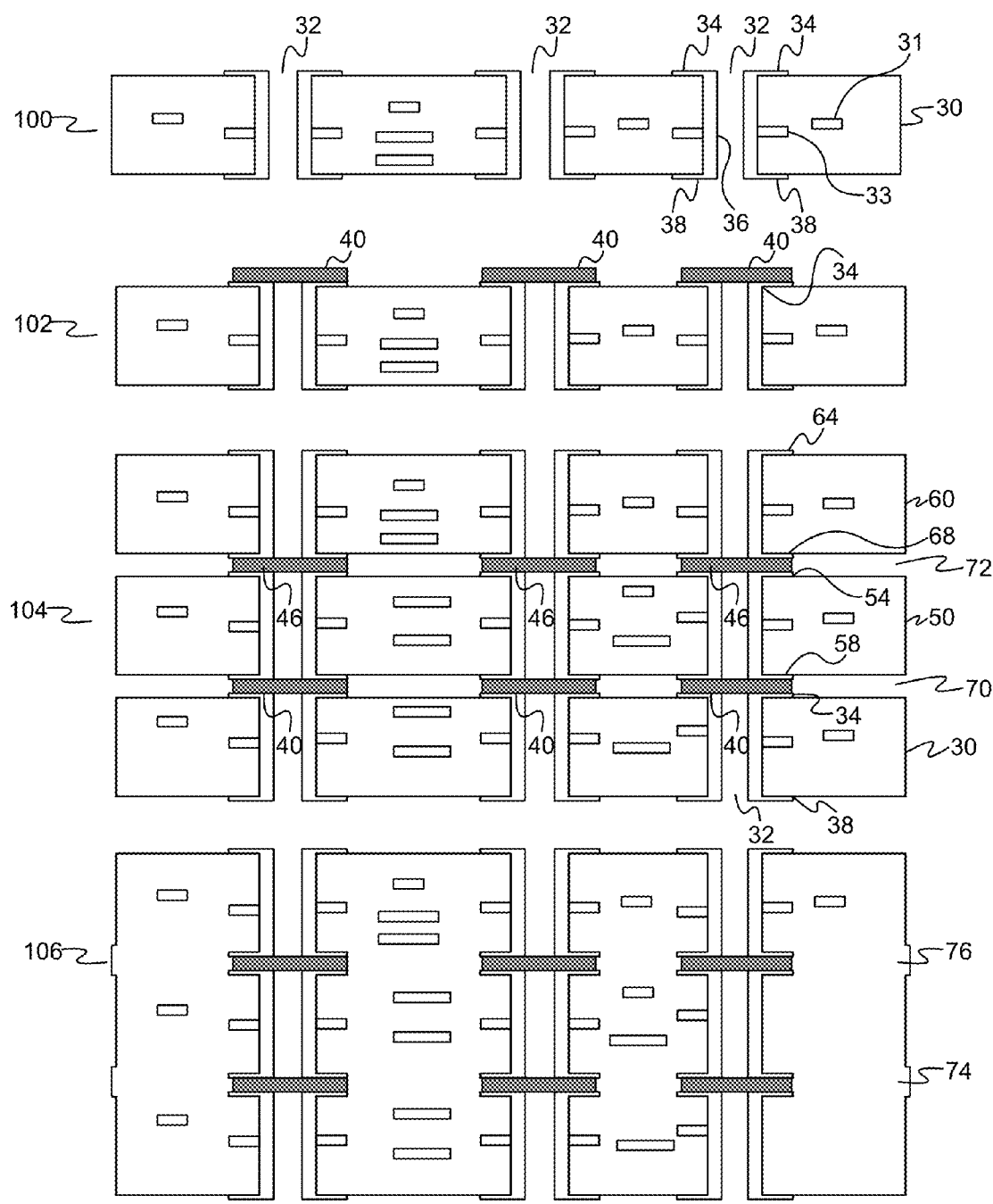
FIG. 2 illustrates a method of fabricating a PCB similar to that of FIG. 1 according to an embodiment.

FIG. 2 illustrates a method of fabricating a PCB similar to that of FIG. 1 according to an embodiment. At the step 100, the thinner PCBs are fabricated. FIG. 2 shows a first thinner PCB 30 at the step 100. The method of FIG. 2 shows the fabrication of an exemplary PCB that has three thinner PCBs laminated together. It is understood that the completed PCB can be made of more or less than three thinner PCBs. Each of the thinner PCBs has one or more layers, where a layer includes both a non-conductive substrate portion and a conductive material portion. Each layer of the thinner PCB can include one or more conductive interconnects made of the conductive material, for example an internal interconnect 31 and a post interconnect 33 in the thinner PCB 30. Each thinner PCB can have the same or different number of layers than the other thinner PCBs. Each thinner PCB has a first surface and a second surface opposing the first surface, and one or more PTHs extending from the first surface through the thinner PCB to the second surface. A barrel wall that forms the through hole is plated as are surface contact points on the first surface and the second surface adjacent the through hole opening. In some embodiments, the surface contact points, the plating in the barrel and/or the conductive traces are made of copper. Alternatively, other conductive metals or metal combinations can be used. The surface contact points, the plating in the barrel and/or the conductive traces can be plated, for example, with Ni/Au, solder such as tin or lead free solder, OSP (Organic Solderability Preservative), or without plating. As applied to the thinner PCB 30 in FIG. 2, PTHs 32 include barrel wall plating 36. Surface contact points 34 are positioned on a first surface of the thinner PCB 30 and surface contact points 38 on a second surface of the thinner PCB 30. Surface contact points 34 and 38 are electrically connected to barrel wall plating 36 within a corresponding PTH 32.

At the step 102, a metal interconnect material 40 is applied to the surface contact points 34 on the first surface of the thinner PCB 30. In some embodiments, the metal interconnect material 40 is the same material as the material used for the surface contact points 34 and the plating 36. In other embodiments, the metal interconnect material 40 includes one or more different materials than the surface contact points 34 and the plating 36, but has a same or similar coefficient of thermal expansion (CTE) as the material used for the surface contact points 34 and the plating 36. In some embodiments, the metal interconnect material 40 is an ink that includes metal nano-particles and solvent, where the solvent dissolves evaporates upon sintering in a subsequent step. In some embodiments, the metal nano-particles are copper nano-particles. The viscosity of the ink can be adjusted to prevent, or minimize, ink from flowing into the PTH 32. In some embodiments, the metal interconnect material 40 is applied as a powder. In still other embodiments, the metal interconnect material 40 is applied as a foil. In some embodiments, the metal interconnect material 40 is applied over the surface contact point 34 and the opening of the adjacent PTH 32, such as with using a foil or ink with sufficient viscosity. In other embodiments, the metal interconnect material 40 is applied over the surface contact points 34, but not over the opening of the adjacent PTH 32.

At the step 104, additional thinner PCBs and metal interconnect material are added. Specifically, a second thinner PCB 50 is stacked onto the thinner PCB 30 such that corresponding PTHs are aligned. Surface contact points 58 on a second surface of the thinner PCB 50 are coupled to the metal interface material 40 applied to corresponding surface contact points 34 on the first surface of the thinner PCB 30. A gap 70 is formed between the first surface of the thinner PCB 30 and the second surface of the thinner PCB 50 due to a thickness of the metal interconnect material 40. A metal interconnect material 46 is applied to the surface contact points 54 on the first surface of the thinner PCB 50. A third thinner PCB 60 is stacked onto the thinner PCB 50 such that corresponding PTHs are aligned. Surface contact points 68 on a second surface of the thinner PCB 60 are coupled to the metal interface material 46 applied to corresponding surface contact points 54 on the first surface of the thinner PCB 50. A gap 72 is formed between the first surface of the thinner PCB 50 and the second surface of the thinner PCB 60 due to a thickness of the metal interconnect material 46. Metal interconnect material is not applied to the surface contact points on the top and bottom surface of the stack, for example the surface contact points 38 on the second surface of the thinner PCB 30 and the surface contact points 64 on the first surface of the thinner PCB 60.

At the step 106, a lamination process is performed by applying heat and pressure to the stack formed at the step 104. Application of the heat and pressure sinters the metal interconnect material and the corresponding surface contact points coupled to the metal interconnect material. As applied to the stack shown in the step 104, the surface contact point 34, the metal interconnect material 40 and the surface contact point 58 are sintered, and the surface contact point 54, the metal interconnect material 46 and the surface contact point 68 are sintered. The sintered metal interconnect material and corresponding surface contact points form a solid connection, both mechanical and electrical, between adjacent thinner PCBs. During the lamination process, the non-conductive substrate, for example the PCB laminate material or prepreg, flows into the gaps 70 and 72 between the stacked thinner PCBs, as shown in areas 74 and 76 at the step 106. In some embodiments, a sintering temperature of greater than or equal to 200 C is needed for the lamination process. When the metal interconnect material is an ink, the solvent in the ink evaporates through the PTHs during the lamination process.

Figure 3:
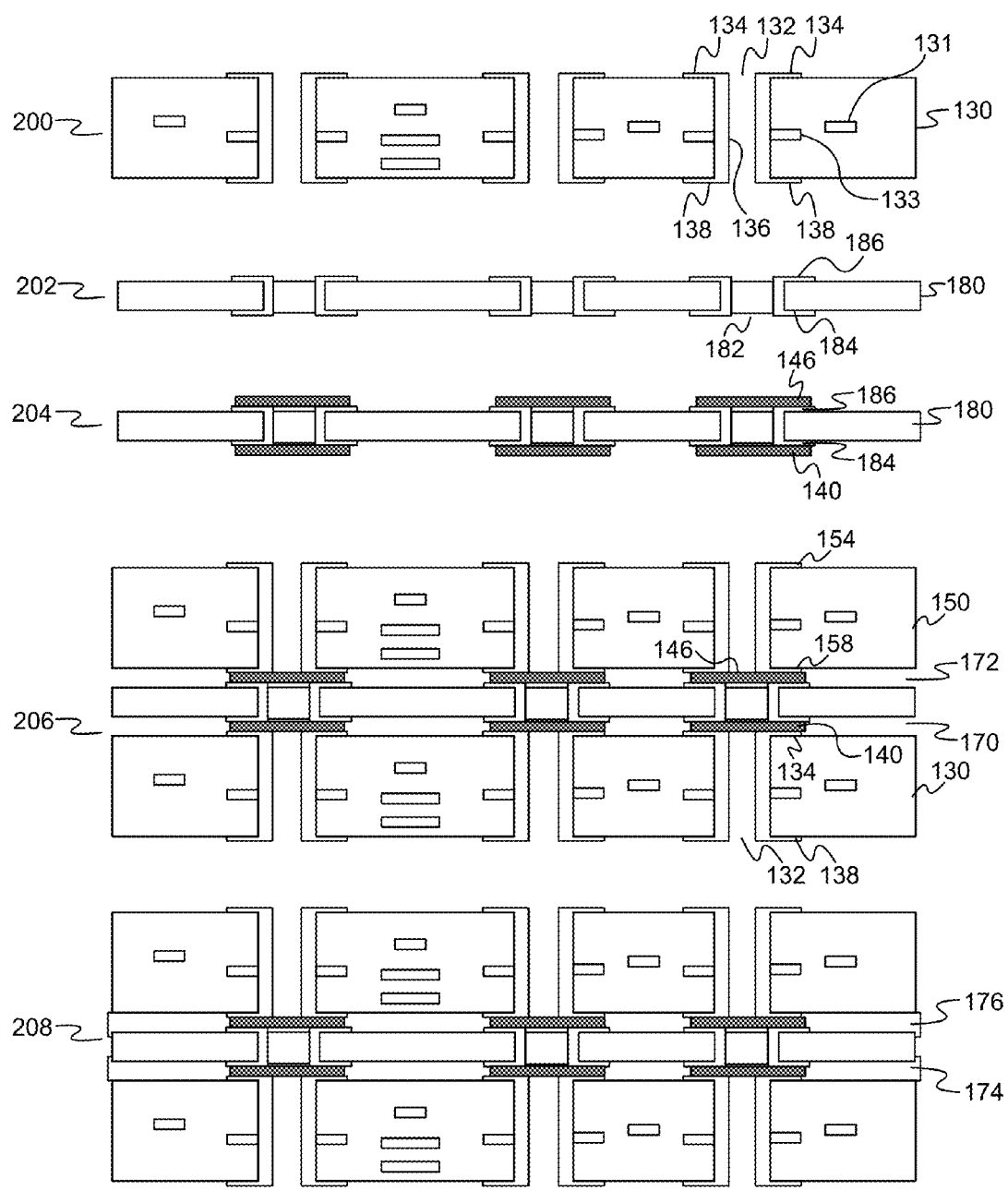
FIG. 3 illustrates a method of fabricating a PCB according to another embodiment.

FIG. 3 illustrates a method of fabricating a PCB according to another embodiment. In this alternative embodiment, multiple thinner PCBs are laminated together using a PCB interposer between adjacent thinner PCBs. At the step 200, the thinner PCBs are fabricated. FIG. 3 shows a first thinner PCB 130 at the step 200. The method of FIG. 3 shows the fabrication of an exemplary PCB that has two thinner PCBs laminated together. It is understood that the completed PCB can be made of more than two thinner PCBs. Each of the thinner PCBs has one or more layers, where a layer includes both a non-conductive substrate portion and a conductive material portion. Each layer of the thinner PCB can include one or more conductive interconnects made of the conductive material, for example an internal interconnect 131 and a post interconnect 133 in the thinner PCB 130. Each thinner PCB can have the same or different number of layers than the other thinner PCBs. Each thinner PCB has a first surface and a second surface opposing the first surface, and one or more PTHs extending from the first surface through the thinner PCB to the second surface. A barrel wall that forms the through hole is plated as are surface contact points on the first surface and the second surface adjacent the through hole opening. In some embodiments, the surface contact points, the plating in the barrel and/or the conductive traces are made of copper. Alternatively, other conductive metals or metal combinations can be used. The surface contact points, the plating in the barrel and/or the conductive traces can be plated, for example, with Ni/Au, solder such as tin or lead free solder, OSP (Organic Solderability Preservative), or without plating. As applied to the thinner PCB 130 in FIG. 3, PTHs 132 include barrel wall plating 136. Surface contact points 134 are positioned on a first surface of the thinner PCB 130 and surface contact points 138 on a second surface of the thinner PCB 130. Surface contact points 134 and 138 are electrically connected to barrel wall plating 136 within a corresponding PTH 132.

At the step 202, a PCB interposer is fabricated. In some embodiments, the PCB interposer is simply a single layer PCB including a non-conductive substrate 180. The PCB interposer has a first surface and a second surface opposing the first surface, and one or more through holes extending from the first surface through the non-conductive substrate 180 to the second surface. In some embodiments, the through holes are filled metal, such as copper, as shown in FIG. 3. In this case, the barrel wall that formed the through hole can be plated or without plating. In other embodiments, the through holes are not filled with metal. In this case, the through holes are plated, such as the PTHs 132 in the thinner PCB 130. Surface contact points 186 are positioned on a first surface of the non-conductive substrate 180 and surface contact points 184 on a second surface of the non-conductive substrate 180. Surface contact points 184 and 186 are electrically connected to the metal filling within a corresponding PTH 182, or the barrel wall plating if the through hole is not filled with metal.

At the step 204, a metal interconnect material is applied. In some embodiments, as is the embodiment shown in step 204, the metal interconnect material is applied to the surface contact points 184 and 186 on both surfaces of the PCB interposer of step 180. This embodiment is shown in the step 204 where a metal interconnect material 140 is applied to the surface contact points 184 and a metal interconnect material 146 is applied to the surface contact points 184. In other embodiments, the metal interconnect material 140 is applied to the surface contact points 134 on the first surface of the thinner PCB 130, the PCB interposer is stacked onto the thinner PCB 130 as described below, and the metal interconnect material 146 is then applied to the surface contact points 186 on the PCB interposer. In some embodiments, the metal interconnect material 140 is the same material as the material used for the surface contact points 134 and the metal filling the through holes 182. In other embodiments, the metal interconnect material 140 includes one or more different materials than the surface contact points 134 and the metal filling the through holes 182, but has a same or similar coefficient of thermal expansion (CTE) as the material used for the surface contact points 134 and the metal filling the through holes 182. In some embodiments, the metal interconnect material is of the same type and can be applied in the same manner as described above in relation to FIG. 2.

At the step 206, the PCB interposer from step 204 is stacked on the thinner PCB 130 such that corresponding PTHs are aligned. Surface contact points 134 on the first surface of the thinner PCB 130 are coupled to the metal interface material 140 applied to corresponding surface contact points 184 on the second surface of the PCB interposer. A gap 170 is formed between the first surface of the thinner PCB 130 and the second surface of the PCB interposer due to a thickness of the metal interconnect material 410. A second thinner PCB 150 is stacked onto the PCB interposer such that corresponding PTHs are aligned. Surface contact points 158 on a second surface of the thinner PCB 150 are coupled to the metal interface material 146 applied to corresponding surface contact points 186 on the first surface of the PCB interposer. A gap 172 is formed between the first surface of the PCB interposer and the second surface of the thinner PCB 150 due to a thickness of the metal interconnect material 146. Metal interconnect material is not applied to the surface contact points on the top and bottom surface of the stack, for example the surface contact points 138 on the second surface of the thinner PCB 130 and the surface contact points 154 on the first surface of the thinner PCB 150.

At the step 208, a lamination process is performed by applying heat and pressure to the stack formed at the step 206. Application of the heat and pressure sinters the metal interconnect material and the corresponding surface contact points coupled to the metal interconnect material. As applied to the stack shown in the step 206, the surface contact point 134, the metal interconnect material 140 and the surface contact point 184 are sintered, and the surface contact point 158, the metal interconnect material 146 and the surface contact point 186 are sintered. During the lamination process, the non-conductive substrate, for example the PCB laminate material or prepreg, flows into the gaps 170 and 172 between the stacked thinner PCBs and the PCB interposer, as shown in areas 174 and 176 at the step 208. In some embodiments, a sintering temperature of greater than or equal to 200 C is needed for the lamination process. When the metal interconnect material is an ink, the solvent in the ink evaporates through the PTHs during the lamination process.

The PCB and method of manufacturing described above enables manufacturing a PCB, such as a backplane, as thick as needed without fabrication technology restrictions. The fabrication process is facilitated by use of mild sintering temperature and conventional lamination pressure. Providing a thicker PCB with solid metal interconnects between the laminated thinner PCBs satisfies high reliability system requirements.

The present application has been described in terms of specific embodiments incorporating details to facilitate the understanding of the principles of construction and operation of the printed circuit board. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A printed circuit board comprising;
   a. a plurality of printed circuit boards, wherein each printed circuit board comprises one or more layers of non-conducting substrate and conducting material, further wherein each printed circuit board further comprises one or more plated through holes, each plated through hole having a surface contact point on either end; and
   b. a metal interconnect material,
   wherein the plurality of printed circuit boards are stacked on top of each other such that corresponding plated through holes on each printed circuit board are properly aligned, further wherein the metal interconnect material is positioned between the surface contact points of plated through holes on adjacently stacked printed circuit boards, wherein the plurality of circuit boards are laminated together thereby sintering the metal interconnect material and the surface contact points of the plated through holes.

2. The printed circuit board of claim 1 wherein a given printed circuit board of the plurality of circuit boards has multiple layers, and the multiple layers are laminated together.

3. The printed circuit board of claim 1 wherein the metal interconnect material is a same material as a plating material of the plated through holes.

4. The printed circuit board of claim 3 wherein the metal interconnect material is copper and the plated through holes are plated with copper.

5. The printed circuit board of claim 4 wherein the metal interconnect material is made of copper nano-particles.

6. The printed circuit board of claim 4 wherein the metal interconnect material is made of copper nano-particle ink.

7. The printed circuit board of claim 1 wherein the non-conducting substrate comprises a prepreg material.

8. A printed circuit board comprising;
   a. a plurality of printed circuit boards, wherein each printed circuit board comprises one or more layers of non-conducting substrate and conducting material, further wherein each printed circuit board further comprises one or more plated through holes, each plated through hole having a surface contact point on either end;
   b. one or more interposers, wherein each interposer comprises one or more interposer plated through holes, each interposer plated through hole having a surface contact point on either end; and
   b. a metal interconnect material,
   wherein the plurality of printed circuit boards and the one or more interposers are alternatively stacked on top of each other such that corresponding plated through holes on each printed circuit board and interposer plated through holes on each adjacently stacked interposer are properly aligned, further wherein the metal interconnect material is positioned between the surface contact points of plated through holes and the surface contact points on interposer plated through holes on each adjacently stacked printed circuit board and interposer, wherein the plurality of circuit boards and the one or more interposers are laminated together thereby sintering the metal interconnect material, the surface contact points of the plated through holes and the surface contact points of the interposer plated through holes.

9. The printed circuit board of claim 8 wherein a given printed circuit board of the plurality of circuit boards has multiple layers, and the multiple layers are laminated together.

10. The printed circuit board of claim 8 wherein the metal interconnect material is a same material as a plating material of the plated through holes and a plating material of the interposer plated through holes.

11. The printed circuit board of claim 10 wherein the metal interconnect material is copper, the plated through holes are plated with copper and the interposer plated through holes are plated with copper.

12. The printed circuit board of claim 11 wherein the metal interconnect material is made of copper nano-particles.

13. The printed circuit board of claim 11 wherein the metal interconnect material is made of copper nano-particle ink.

14. The printed circuit board of claim 8 wherein the non-conducting substrate comprises a prepreg material.

15. The printed circuit board of claim 8 wherein each interposer comprises a non-conducting substrate.

16. A method of fabricating a printed circuit board, the method comprising:
   a. fabricating a plurality of printed circuit boards, wherein each printed circuit board comprises one or more layers of non-conducting substrate and conducting material, further wherein each printed circuit board further comprises one or more plated through holes, each plated through hole having a surface contact point on either end;
   b. stacking the plurality of printed circuit boards on top of each other with an intermediate metal interconnect material applied between adjacently stacked printed circuit boards, wherein the plurality of printed circuit boards are stacked such that corresponding plated through holes on each printed circuit board are properly aligned, further wherein the metal interconnect material is positioned between the surface contact points of plated through holes on adjacently stacked printed circuit boards; and
   c. laminating the plurality of circuit boards and the one or more interposers together thereby sintering the metal interconnect material and the surface contact points of the plated through holes.

17. The printed circuit board of claim 16 wherein a given printed circuit board of the plurality of circuit boards has multiple layers, and the multiple layers are laminated together.

18. The method of claim 16 wherein the metal interconnect material is a same material as a plating material of the plated through holes.

19. The method of claim 18 wherein the metal interconnect material is copper and the plated through holes are plated with copper.

20. The method of claim 19 wherein the metal interconnect material is made of copper nano-particles.

21. The method of claim 19 wherein the metal interconnect material is made of copper nano-particle ink.

22. The method of claim 16 wherein the non-conducting substrate comprises a prepreg material.

23. A method of fabricating a printed circuit board, the method comprising:
  a. fabricating a plurality of printed circuit boards, wherein each printed circuit board comprises one or more layers of non-conducting substrate and conducting material, further wherein each printed circuit board further comprises one or more plated through holes, each plated through hole having a surface contact point on either end;
  b. fabricating one or more interposers, wherein each interposer comprises one or more interposer plated through holes, each interposer plated through hole having a surface contact point on either end;
  b. alternatively stacking the plurality of printed circuit boards and the one or more interposers on top of each other such that corresponding plated through holes on each printed circuit board and interposer plated through holes on each adjacently stacked interposer are properly aligned, wherein the metal interconnect material is positioned between the surface contact points of plated through holes and the surface contact points on interposer plated through holes on each adjacently stacked printed circuit board and interpose; and
  c. laminating the plurality of circuit boards together thereby sintering the metal interconnect material, the surface contact points of the plated through holes and the surface contact points of the interposer plated through holes.

24. The printed circuit board of claim 23 wherein a given printed circuit board of the plurality of circuit boards has multiple layers, and the multiple layers are laminated together.

25. The method of claim 23 wherein the metal interconnect material is a same material as a plating material of the plated through holes.

26. The method of claim 25 wherein the metal interconnect material is copper and the plated through holes are plated with copper.

27. The method of claim 26 wherein the metal interconnect material is made of copper nano-particles.

28. The method of claim 26 wherein the metal interconnect material is made of copper nano-particle ink.

29. The method of claim 23 wherein the non-conducting substrate comprises a prepreg material.

30. The method of claim 23 wherein each interposer comprises a non-conducting substrate.

* * * * *